United States Patent
Kubouchi (10) Patent No.: US 8,270,237 B2
(45) Date of Patent: Sep. 18, 2012

(54) SEMICONDUCTOR DEVICE, RELIEF-ADDRESS-INFORMATION WRITING DEVICE, AND RELIEF-ADDRESS-INFORMATION WRITING METHOD

(75) Inventor: Shuichi Kubouchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 70 days.

(21) Appl. No.: 12/923,262

(22) Filed: Sep. 10, 2010

(65) Prior Publication Data

US 2011/0063933 A1 Mar. 17, 2011

(30) Foreign Application Priority Data

Sep. 11, 2009 (JP) ................... 2009-210232

(51) Int. Cl.
*G11C 7/00* (2006.01)
(52) U.S. Cl. .................. 365/200; 365/201; 365/185.09; 365/225.7
(58) Field of Classification Search .................. 365/200, 365/201, 185.09, 225.7
See application file for complete search history.

(56) References Cited

U.S. PATENT DOCUMENTS

| 5,995,422 | A | * | 11/1999 | Im et al. ...................... 365/200 |
| 6,538,924 | B2 | * | 3/2003 | Dono et al. .............. 365/185.08 |
| 7,075,835 | B2 | | 7/2006 | Fujima |
| 7,184,330 | B2 | * | 2/2007 | Tajima et al. ................ 365/200 |
| 7,791,966 | B2 | * | 9/2010 | Imai .............................. 365/200 |
| 2007/0217276 | A1 | * | 9/2007 | Sugisawa ................... 365/225.7 |

FOREIGN PATENT DOCUMENTS

JP 2004-303354 10/2004

* cited by examiner

*Primary Examiner* — Connie Yoha
(74) *Attorney, Agent, or Firm* — McGinn IP Law Group, PLLC (57) ABSTRACT

To provided a relief-address generating circuit that generates relief address information based on plural data bits supplied in time sequence via a first terminal from outside and a programming circuit that writes into any one of fuse sets the relief address information generated by the relief-address generating circuit. With this configuration, repetition of a programming operation by the total number of the fuse sets at the maximum completes a series of write processing on relief address information. Therefore, it is possible to reduce the time required for a series of write processing on relief address information.

21 Claims, 8 Drawing Sheets

SEMICONDUCTOR DEVICE, RELIEF-ADDRESS-INFORMATION WRITING DEVICE, AND RELIEF-ADDRESS-INFORMATION WRITING METHOD

BACKGROUND OF THE INVENTION

1. Field of the Invention

The present invention relates to a semiconductor device, and particularly relates to a semiconductor device including a fuse set provided for writing relief address information therein. The present invention also relates to a relief-address-information writing device and relief-address-information writing method for writing relief address information into the semiconductor device.

2. Description of Related Art

A semiconductor device represented by a DRAM (Dynamic Random Access Memory) often includes an address relief circuit that replaces an inoperative and failed memory cell with a redundancy memory cell to relieve the address of the failed memory cell. The address of the failed memory cell, that is, relief address information is detected in an operating test performed at the time of production, and detected relief address information is written into the semiconductor device in question while it is in a wafer state.

As a method of writing relief address information into a semiconductor device, a method has been widely used, which includes cutting a fuse element by irradiating laser beams. However, this method requires devices such as a laser trimmer and it cannot write relief address information into a plurality of semiconductor devices on a wafer at the same time, and therefore the method has a problem of taking a long time for writing.

Meanwhile, a method of storing relief address information using an element called anti-fuse element has commanded attention in recent years (Japanese Patent Application Laid-open No. 2004-303354 or United States Patent Application Publication number 2004/0213056). Initially, the anti-fuse element is in an insulation state, and as a high voltage is applied to cause breakdown, it makes a transition to a conduction state. The anti-fuse element once changed to the conduction state cannot return to the insulation state. Therefore, it can achieve nonvolatile and irreversible retention of information, like usual fuse elements. In this manner, writing into the anti-fuse element is performed electrically, and thus it is possible to write relief address information into a plurality of semiconductor devices on a wafer in parallel.

Figure 8:
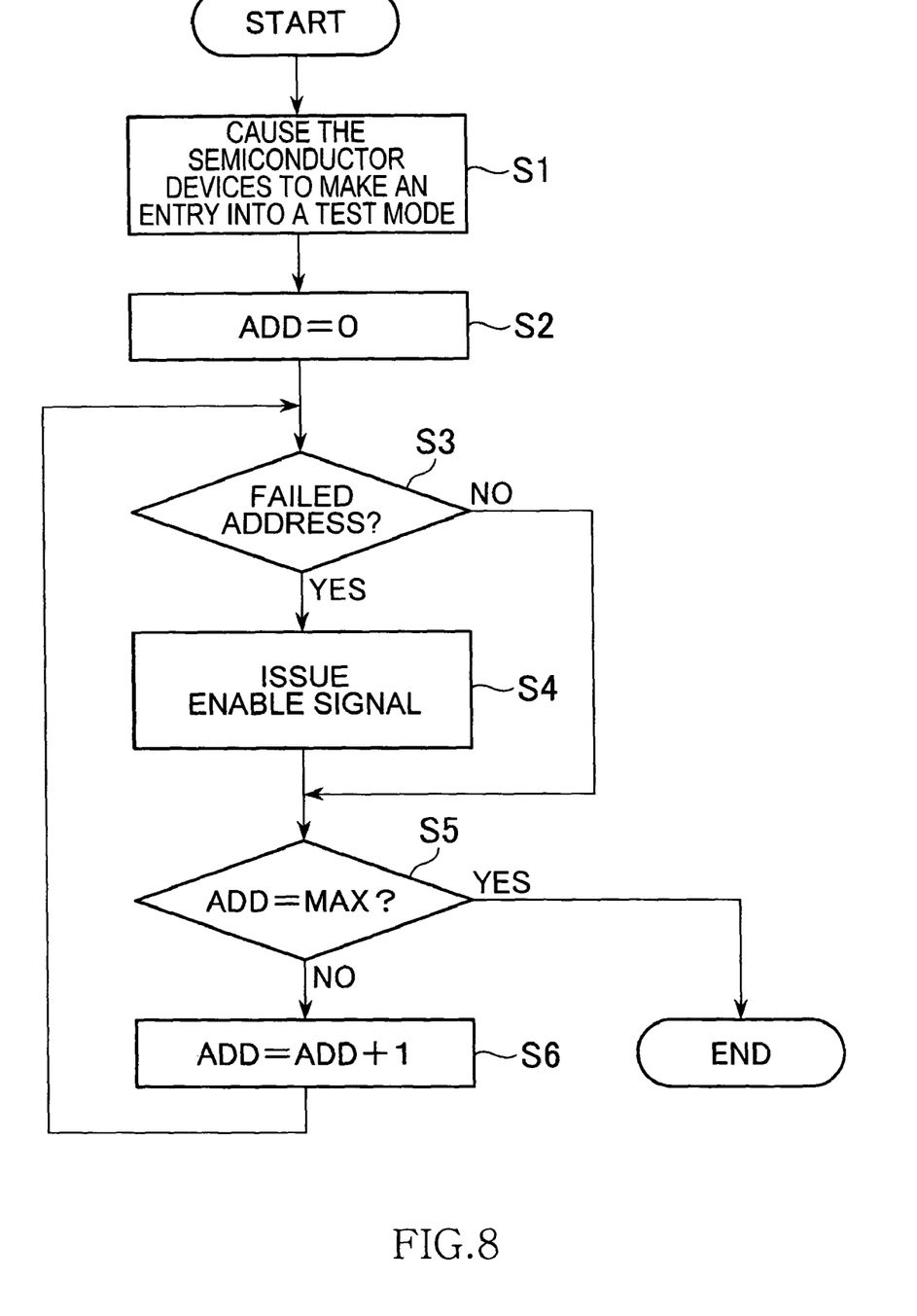
FIG. 8 is a flowchart for explaining a method of writing relief address information according to a prior art.

FIG. 8 is a flowchart for explaining a method of writing relief address information into a plurality of semiconductor devices on a wafer in parallel.

First, a test command is issued to write-target semiconductor devices in common to cause these semiconductor devices to make an entry into a test mode (step S1). Next, after resetting an address counter in a relief-address-information writing device (a tester) (step S2), a determination is made on each of the semiconductor devices whether address information in question corresponds to relief address information (step S3). As a result, to the semiconductor device corresponding to the relief address information (step S3: YES), an enable signal is supplied to instruct writing the relief address information (step S4). On the other hand, to the semiconductor device that does not correspond to the relief address information (step S3: NO), no enable signal is supplied, and as a result, the relief address information is not written. Thus, the relief address information can be written selectively into plural semiconductor devices.

The above operation is performed repeatedly by incrementing the value in the address counter (steps S3 to S6). Such an operation is performed until the value in the address counter indicates a maximum value and finally a series of write processing is completed when the value in the address counter indicates the maximum value (step S5: YES).

The method shown in FIG. 8, however, requires performing the processing mentioned above over the entire address space. Therefore, there is a problem that it takes a relatively long time until a series of write processing is completed. To explain this problem with specific numbers, when the address space contains 8k (=8192) addresses and the time required for processing one address is 70 ms, it takes about 10 minutes to complete a series of write processing.

SUMMARY

In one embodiment, there is provided a semiconductor device comprising: a relief-address generating circuit that generates pieces of information of plural bits about relief address constituted by the plural bits respectively, based on plural first signals supplied in time sequence via at least one first terminal from outside; and a programming circuit that writes into a fuse set the relief address information having bit information generated by the relief-address generating circuit.

In another embodiment, there is provided a device comprising: a first terminal configured to be supplied with a first data signal in a first mode and with a first address signal in a second mode; an information storage circuit configured to be written with address information; and a control circuit coupled between the first terminal and the information storage circuit and activated in the second mode to write the address information into the information storage circuit in response to the first address signal supplied to the first terminal.

Instill another embodiment, there is provided a method comprising: obtaining relief address information for a semiconductor device, the relief address information comprising a plurality of bits; and supplying the semiconductor device with the bits of the relief address information in serial.

According to the present invention, because relief address information is supplied in time sequence, it is not necessary to use terminals of the same number as the bits in the relief address information. With this configuration, terminals individually connected to plural semiconductor devices, for example, data input/output terminals can be used to supply relief address information. Therefore, it is possible to supply different series of relief address information to plural semiconductor devices at the same time. Accordingly, even when the relief address information is written into plural semiconductor devices in parallel, a series of write processing can be completed in a short time.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A preferred embodiment of the present invention is explained below with reference to the accompanying drawings.

Figure 1:
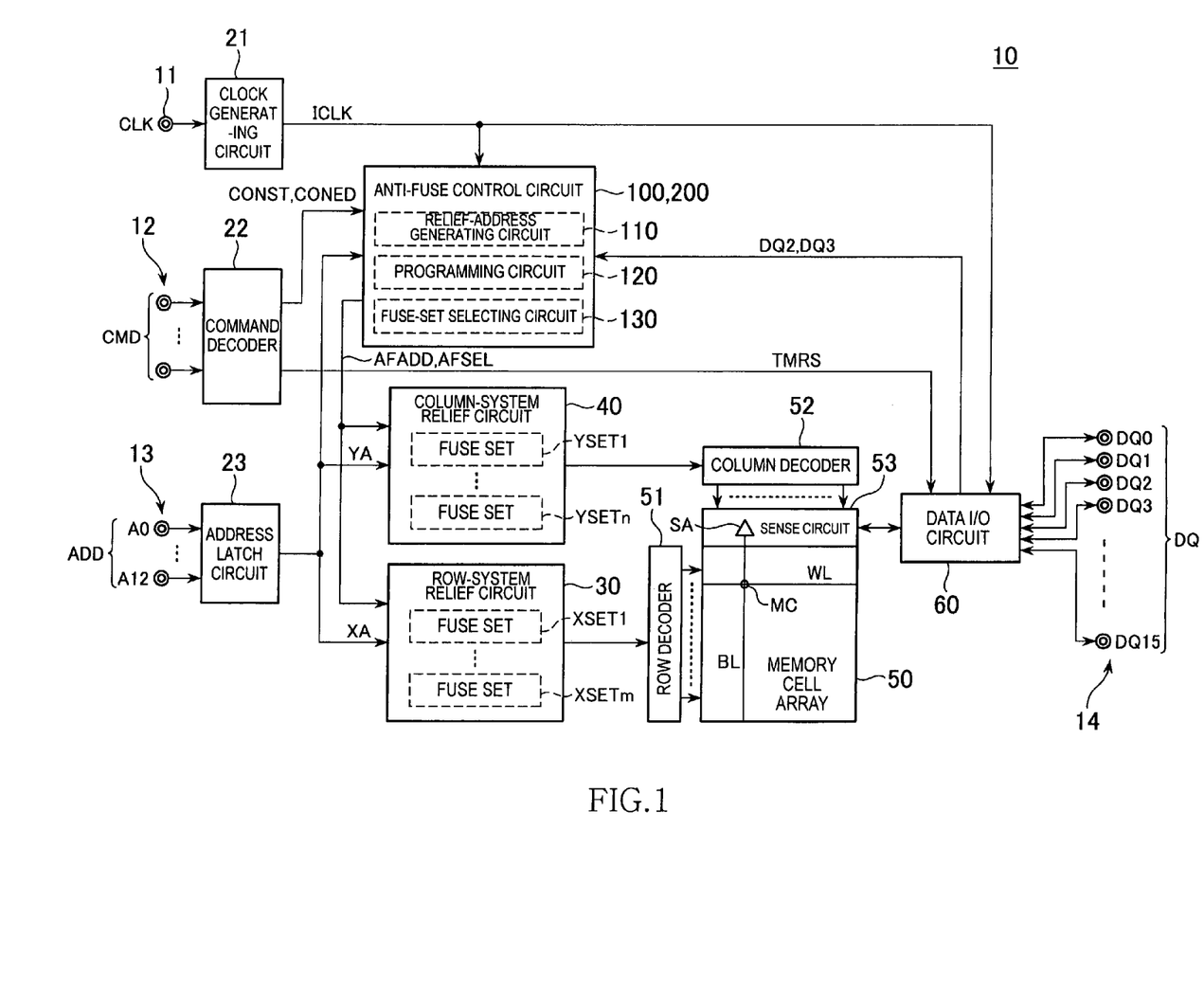
FIG. 1 is a block diagram showing a configuration of a semiconductor device 10 according to a preferred embodiment of the present invention.

FIG. 1 is a block diagram showing a configuration of a semiconductor device 10 according to a preferred embodiment of the present invention.

The semiconductor device 10 according to this embodiment is a DDR SDRAM, which includes, as external terminals, a clock terminal 11, a command terminal group 12, an address terminal group 13, and a data input/output (I/O) terminal group 14. Although not shown in FIG. 1, the semiconductor device 10 also includes other terminals such as a supply terminal and a data strobe terminal.

The clock terminal 11 is a terminal supplied with an external clock signal CK. The supplied external clock signal CK is supplied to a clock generating circuit 21. The clock generating circuit 21 generates an internal clock signal ICLK based on the external clock signal CK and supplies it to various internal circuits such as an anti-fuse control circuit 100, 200. Although details are described later, the anti-fuse control circuit 100, 200 is a control circuit for writing relief address information into anti-fuse elements in a wafer state.

The command terminal group 12 is a terminal group supplied with various external command signals CMD. The external command CMD supplied to the command terminal group 12 is input to a command decoder 22 to generate various internal command signals by the command decoder 22. The internal command signals at least include a relief-address setting command TMRS for instructing start of an input operation on relief address information, a write start command CONST for instructing start of breaking down an anti-fuse element, and a write end command CONED for instructing termination of breaking down the anti-fuse element. Among those commands, the relief-address setting command TMRS is at least supplied to a data I/O circuit 60 and the write start command CONST and the write end command CONED are supplied at least to the anti-fuse control circuit 100, 200.

The address terminal group 13 is a terminal group supplied with an address signal ADD constituted by address bits A0 to A12. The supplied address signal ADD is supplied to an address latch circuit 23. Among the address signal ADD latched in the address latch circuit 23, a row address XA is supplied to a row-system relief circuit 30 and a column address YA is supplied to a column-system relief circuit 40.

The row-system relief circuit 30 includes plural fuse sets XSET1 to XSETm. Each of the fuse sets XSET1 to XSETm includes plural anti-fuse elements, which store a row address (relief address information) that corresponds to a failed word line. If the row address XA supplied from the address latch circuit 23 matches any one of series of relief address information stored in the fuse sets XSET1 to XSETm, the row-system relief circuit 30 supplies a replaced row address to a row decoder 51, thereby making alternative access not to the failed word line but to a redundant word line. On the other hand, if the row address XA supplied from the address latch circuit 23 matches none of the series of relief address information stored in the fuse sets XSET1 to XSETm, the row address XA is supplied to the row decoder 51 as it is.

Similarly, the column-system relief circuit 40 includes plural fuse sets YSET1 to YSETm. Each of the fuse sets YSET1 to YSETm includes plural anti-fuse elements, which store a column address (relief address information) that corresponds to a failed bit line. If the column address YA supplied from the address latch circuit 23 matches any one of series of relief address information stored in the fuse sets YSET1 to YSETm, the column-system relief circuit 40 supplies a replaced column address to a column decoder 52, thereby making alternative access not to the failed bit line but to a redundant bit line. On the other hand, if the column address YA supplied from the address latch circuit 23 matches none of the series of relief address information stored in the fuse sets YSET1 to YSETm, the column address YA is supplied to the column decoder 52 as it is.

The row decoder 51 is a circuit that selects among word lines (or redundant word lines) WL included in a memory cell array 50. In the memory cell array 50, plural word lines (or redundant word lines) WL cross plural bit lines (or redundant bit lines) BL, and memory cells are arranged at the crosspoints (FIG. 1 only shows one word line WL, one bit line BL and one memory cell MC). The bit lines (or redundant bit lines) BL are connected to the corresponding sense amplifiers SA in a sense circuit 53.

The column decoder 52 selects among sense amplifiers SA included in the sense circuit 53. The sense amplifier SA selected by the column decoder 52 is connected to the data I/O circuit 60. The data I/O circuit 60 is connected to the data I/O terminal group 14.

The data I/O terminal group 14 is a terminal group provided for input/output of data DQ constituted by data bits DQ0 to DQ15. That is, at the time of reading, read data read out of the memory cell array 50 via the sense circuit 53 and the data I/O circuit 60 is output from the data I/O terminal group 14. On the other hand, at the time of writing, write data input to the data I/O terminal group 14 is written into the memory cell array 50 via the data I/O circuit 60 and the sense circuit 53. These operations of the data I/O circuit 60 are performed in synchronization with the internal clock signal ICLK.

The data I/O circuit 60 is also supplied with the relief-address setting command TMRS from the command decoder 22. When the relief-address setting command TMRS is activated, the data I/O circuit 60 supplies the anti-fuse control circuit 100, 200 with data bits DQ2 and DQ3 that are received via the data I/O terminal group 14. As shown in FIG. 1, the anti-fuse control circuit 100, 200 includes a relief-address generating circuit 110, a programming circuit 120, and a fuse-set selecting circuit 130.

The overall configuration of the semiconductor device 10 is as described above.

Figure 2:
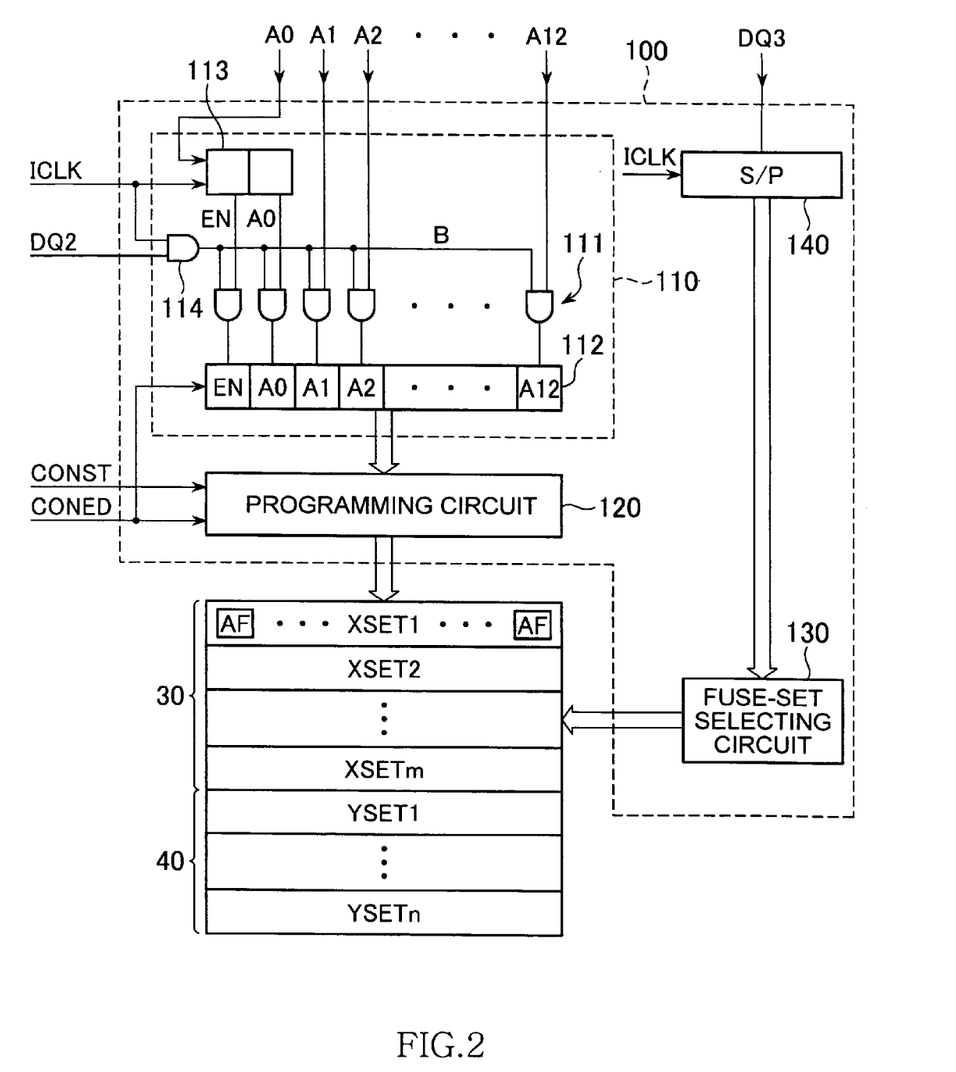
FIG. 2 is a block diagram showing a circuit configuration of the anti-fuse control circuit 100 according to a first embodiment of the present invention.

FIG. 2 is a block diagram showing a circuit configuration of the anti-fuse control circuit 100 according to a first embodiment of the present invention. As described above, the anti-fuse control circuit 100 includes the relief-address generating circuit 110, the programming circuit 120, and the fuse-set selecting circuit 130.

As shown in FIG. 2, the relief-address generating circuit 110 includes an AND gate group 111 and a latch circuit 112 that latches the output from the AND gate group 111. In the AND gate group 111, the input terminals on one side are supplied with the address bits A0 to A12 and an enable bit EN, and the input terminals on the other side are supplied with a bit signal B in common.

As shown in FIG. 2, the address bits A1 to A12 input to the AND gate group 111 are supplied from corresponding terminals included in the address terminal group 13, respectively. On the other hand, the address bit A0 and the enable bit EN input to the AND gate group 111 are both supplied from the terminal corresponding to the address bit A0 included in the address terminal group 13 and separated from each other through serial/parallel conversion at a shifter 113. The shifter 113 shifts the serially input address bit A0 based on the internal clock signal ICLK, thereby performing the serial/parallel conversion. The method of inputting the enable bit EN is not limited thereto, and other methods can be applied, such as a method of inputting the enable bit EN separately from a terminal other than the address terminal group. It is needless to mention, if it is a circuit configuration that requires no enable bit EN, it can be omitted.

The bit signal B is generated at an AND gate 114 that takes a logical AND between the data bit DQ2 and the internal clock signal ICLK. The data bit DQ2 is a signal input from a corresponding terminal in the data I/O terminal group 14, and it is supplied from the data I/O circuit 60 when the relief-address setting command TMRS is activated.

The latch circuit 112 is constituted by plural SR latch circuits that latch the outputs from the AND gate group 111, respectively. These SR latch circuits are all reset by the write end command CONED and set by the corresponding address bit A0 to A12 or the enable bit EN when it is activated (high level). Therefore, once the SR latch circuits are set, they are not reset until the write end command CONED is activated.

With the above configuration, when the address bits A0 to A12 and the enable bit EN are brought to a high level after the relief-address setting command TMRS is issued, the corresponding SR latch circuits are set at the timing the data bit DQ2 is activated to the high level. Thus, the relief address information is temporarily latched in the latch circuit 112. In the first embodiment, however, the plural address bits A0 to A12 and the enable bit EN are not activated at the same time but activated bit by bit in order. That is, among the address bits A0 to A12 and the enable bit EN, only one bit indicates the active level, and the position of the bit indicating the active level shifts. This is because, as described later in detail, settings of the relief address information to the latch circuit 112 are performed over plural semiconductor devices in parallel. Therefore, as for the data bit DQ2, the same number as the address bits A0 to A12 and the enable bit EN, that is, 14 bits are required, and they are divided and input serially at 14 times.

The relief address information temporarily latched in the latch circuit 112 is supplied to the programming circuit 120. The programming circuit 120 programs any one of the fuse sets XSET1 to XSETm and YSET1 to YSETn with the supplied relief address information in response to activation of the write start command CONST supplied from the command decoder 22. Which one of the fuse sets XSET1 to XSETm and YSET1 to YSETn is to be programmed is designated from the fuse-set selecting circuit 130. Such a programming operation is terminated in response to activation of the write end command CONED supplied from the command decoder 22.

Although not particularly limited thereto, it is preferable to program fuse sets in a bit-by-bit manner. This is because a programming operation is also performed by plural semiconductor devices in parallel, and therefore if it is intended to program all bits in relief address information at the same time, the current supply capability of a tester (a relief-address-information writing device) may be exceeded. In the first embodiment, the relief address information includes 14 bits and accordingly they are dividedly programmed at 14 times. As an example, when the time required for programming one bit is 5 ms, then the time required for programming a series of relief address information is 70 ms.

The fuse-set selecting circuit 130 selects among the fuse sets based on the data bit DQ3 parallel-converted by a serial/parallel conversion circuit 140. The serial/parallel conversion circuit 140 is a circuit that latches the serially-input data bit DQ3 one after another in synchronization with the internal clock signal ICLK, thereby performing the serial/parallel conversion. The data bit DQ3 is a signal input from the corresponding terminal in the data I/O terminal group 14 and supplied from the data I/O circuit 60 when the relief-address-information setting command TMRS is activated.

While the number of fuse sets differs depending on the semiconductor device, the fuse sets included in the row-system relief circuit 30 and those included in the column-system relief circuit 40 are often provided about 1200 sets in total. In this case, the data bit DQ3 required for selecting among the fuse sets is 11 bits, and it can be specified with 14 bits even if a 3-bit bank address is added. In this manner, the number of bits required for the data bit DQ2 almost matches that of bits required for the data bit DQ3, and accordingly these can be accepted at the same time.

Figure 3:
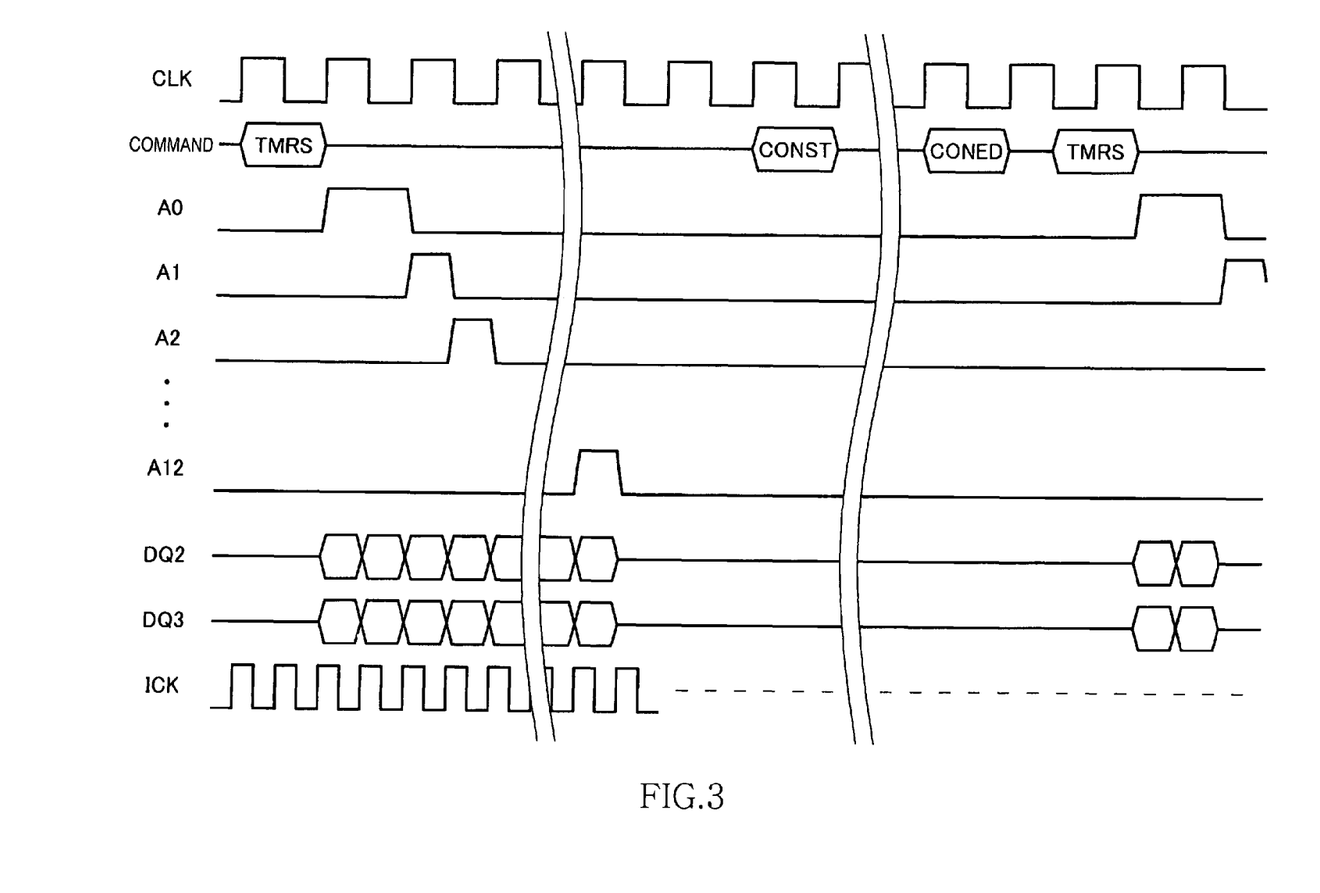
FIG. 3 is a timing chart for explaining an operation of the anti-fuse control circuit 100.

FIG. 3 is a timing chart for explaining an operation of the anti-fuse control circuit 100.

As shown in FIG. 3, after the relief-address setting command TMRS is issued, the address bits A0 to A12 are brought to a high level in this order. The input cycle of the address bit is fundamentally equal to one clock cycle while the address bit A0 is retained at an active level (a high level) over two clock cycles. This is because generation of the enable bit EN and the address bit A0 is required by the serial/parallel conversion at the shifter 113 shown in FIG. 2. Therefore, the input cycle of all the address bits including the address bit A0 can be considered as one clock cycle in practice.

In conjunction with inputting address bits, the data bits DQ2 and DQ3 are serially input. Among these bits, the data bit DQ2 is used as a signal that indicates whether the logical value of the bit, among the bits in the relief address information to be written, corresponding to the currently activated address bit is 1 or 0. Specifically, if the logical value of the bit corresponding to the currently activated address bit is 1, then the data bit DQ2 is brought to a high level, and if the logical value of the bit corresponding to the currently activated address bit is 0, the data bit DQ2 is brought to a low level. Therefore, it is required that the activation timing for the data bit DQ2 is always synchronized with the activation timing for the address bits A0 to A12.

On the other hand, the data bit DQ3 is a signal that designates the fuse set provided for writing relief address information. Therefore, it is not required that the activation timing for that data bit is synchronized with that for the address bits A0 to A12. However, in the first embodiment, these are synchronized with each other. Therefore, inputting of the relief address information and designating of the fuse set are performed at the same time. Accordingly, the time required for inputting can be reduced. The number of bits of the data bit DQ3 depends on the total number of the fuse sets, and thus it is not always required to input all the bits thereof at the same time as the data bit DQ2.

After the inputting of the relief address information and the designating of the fuse set are completed, the write start command CONST is issued. As a result, the relief address information input to the latch circuit 112 is written into the fuse set. A writing operation is performed by breaking down the anti-fuse element AF. For example, the anti-fuse element broken down is assigned with the logic level=1, while the anti-fuse element not broken down is assigned with the logic level=0. In this manner, it is possible to store the relief address information in a nonvolatile and irreversible manner. As described above, programming the fuse set is performed bit by bit.

At the timing the writing to the designated fuse set is completed, the write end command CONEN is issued, thereby completing the writing on the corresponding address. Thereafter, the above operation is repeated to write all the series of relief address information into the fuse sets, respectively.

As described above, according to the first embodiment, while shifting the active level on the address bits A0 to A12, the data bit DQ2 is used to designate the logic level on the corresponding bit in the relief address information. Therefore, repetition of the processing shown in FIG. 3 by the total number of the fuse sets at the maximum makes it possible to complete a series of write processing on relief address information. That is, it is not required to scan over the entire address space as in conventional semiconductor devices. Therefore, it is possible to reduce the time required for a series of write processing on relief address information. Specifically, as described above, if the time required for programming a series of relief address information is 70 ms and if the total number of fuse sets is equal to 1200 sets, the time required for a series of processing is 84 seconds, and thus it is possible to reduce the processing time greatly shorter than that of conventional techniques.

A method of performing write processing on relief address information over plural semiconductor devices in parallel is specifically described next.

Figure 4:
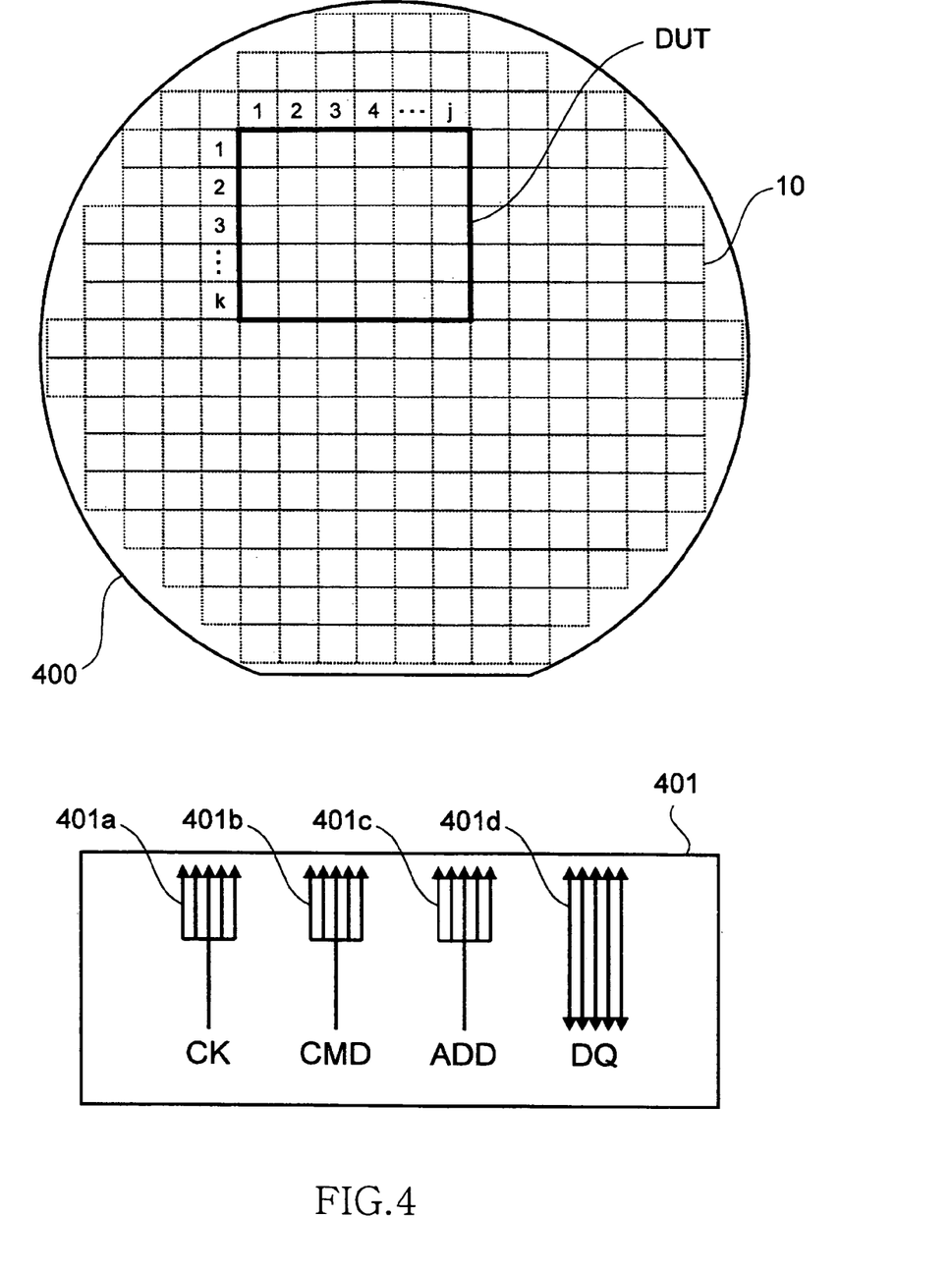
FIG. 4 is a schematic diagram showing a wafer with plural semiconductor devices formed thereon, and a configuration of a probe card for performing write processing on relief address information over these semiconductor devices in parallel.

FIG. 4 is a schematic diagram showing a wafer with plural semiconductor devices formed thereon, and a configuration of a probe card for performing write processing on relief address information over these semiconductor devices in parallel.

As shown in FIG. 4, a wafer 400 includes plural semiconductor devices 10 formed thereon in matrix, of which (j×k) semiconductor devices are subjected to parallel write processing on relief address information. The (j×k) semiconductor devices subjected to parallel processing is a so-called DUT (Device Under Test). The number of DUT depends on the configuration of a probe card 401 provided on the tester and around 200 semiconductor devices, for example, are processed in parallel.

The probe card 401 has many probes for making contact with terminals provided on the semiconductor devices 10 as a processing target. However, as shown in FIG. 4, a probe 401a for supplying the external clock signal CK, a probe 401b for supplying the command signal CMD, and a probe 401c for supplying the address signal ADD are connected among chips in common. That is, the common external clock signal CK, command signal CMD, and address signal ADD are given to these semiconductor devices 10. Meanwhile, a probe 401d for sending/receiving data DQ is not connected in common but connected individually to each chip. Therefore, as for the data bits DQ2 and DQ3 described above, an individual value can be supplied to each of the semiconductor devices.

Figure 5:
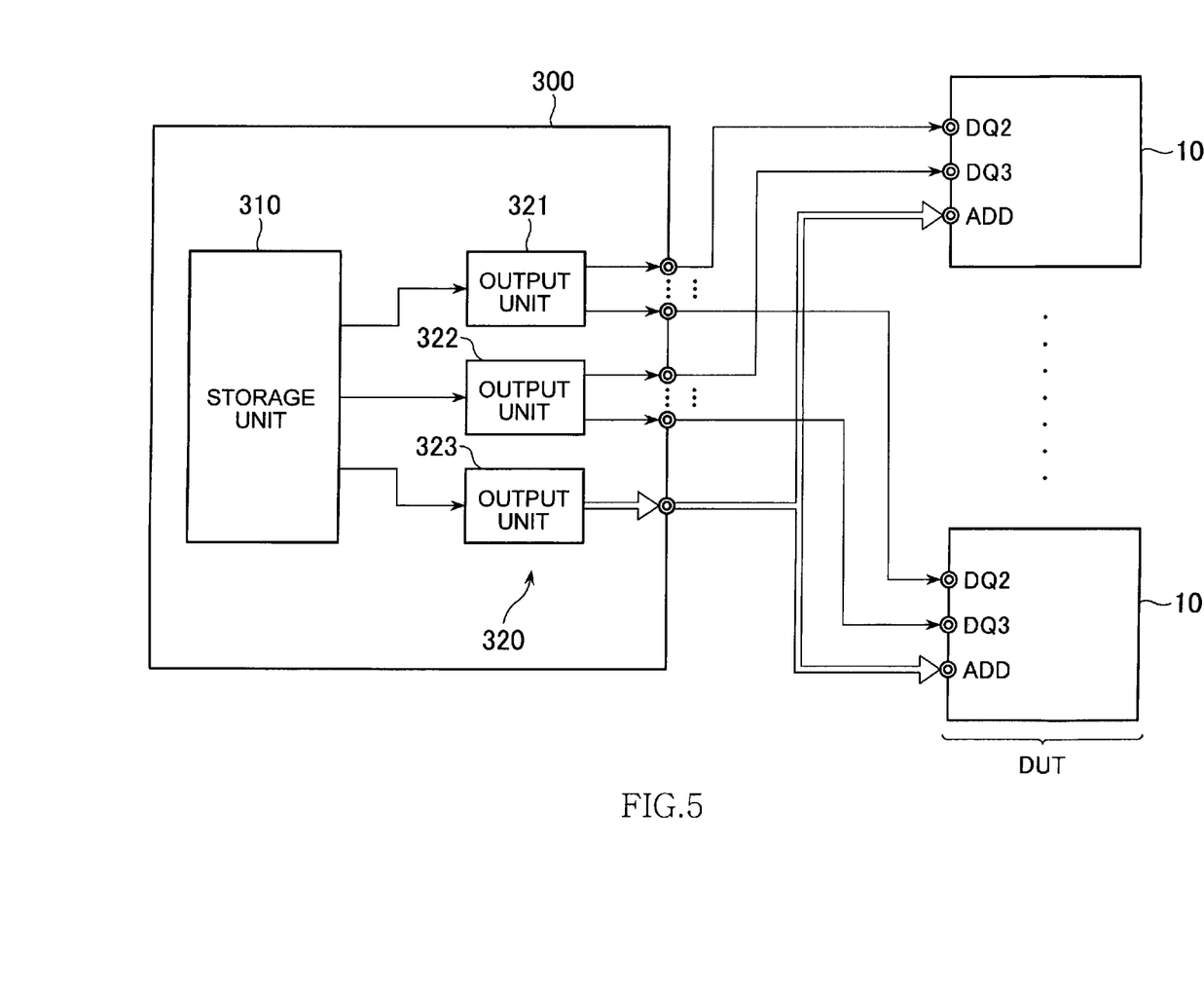
FIG. 5 is a block diagram showing a connecting relation between a relief-address-information writing device and plural semiconductor devices (DUTs)

FIG. 5 is a block diagram showing a connecting relation between a relief-address-information writing device and plural semiconductor devices (DUTs).

As shown in FIG. 5, a relief-address-information writing device 300 includes a storage unit 310 that stores relief address information for plural semiconductor devices 10 and an output unit 320 that supplies various signals to each of the semiconductor devices 10. The output unit 320 includes an output unit 321 that supplies the data bit DQ2 individually to each of the semiconductor devices 10, an output unit 322 that supplies the data bit DQ3 individually to each of the semiconductor devices 10, and an output unit 323 that supplies the address bits A0 to A12 to plural semiconductor devices 10 in common. These output units 321 to 323 refer to the storage unit 310 so as to acquire relief address information for the plural semiconductor devices 10 and, based on the information, output the corresponding data to the plural semiconductor devices 10.

As the relief-address-information writing device 300 having such a configuration is used, the data bits DQ2 and DQ3 can be supplied individually to each of the semiconductor devices 10 while supplying the address bits A0 to A12 to the plural semiconductor devices 10 in common. In this manner, a series of relief address information different from each other among the semiconductor devices 10 can be written into different fuse sets. A specific writing method is as described with reference to FIG. 3.

As described above, according to the first embodiment, it is possible to perform processing of writing different series of relief address information into different fuse sets over plural semiconductor devices in parallel.

Figure 6:
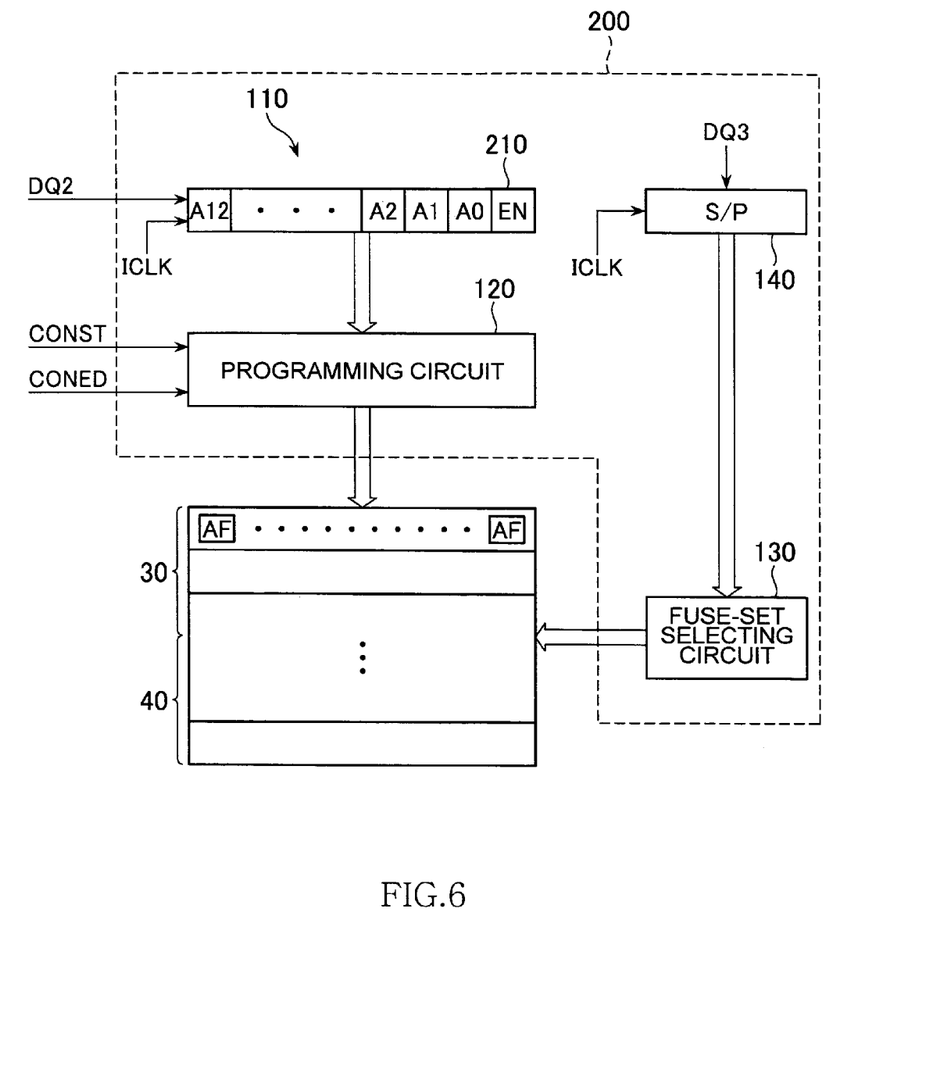
FIG. 6 is a block diagram showing a circuit configuration of the anti-fuse control circuit 200 according to a second embodiment of the present invention.

FIG. 6 is a block diagram showing a circuit configuration of the anti-fuse control circuit 200 according to a second embodiment of the present invention.

As shown in FIG. 6, the anti-fuse control circuit 200 according to the second embodiment is configured such that the relief-address generating circuit 110 is constituted by a shift register 210. Other features of the anti-fuse control circuit 200 are identical to the anti-fuse control circuit 100 shown in FIG. 3, and accordingly like constituent elements are denoted by like reference numerals and redundant explanations thereof will be omitted. The shift register 210 is a circuit that shifts the data bit DQ2 sequentially and a shifting operation is performed in synchronization with the internal clock signal ICLK. In the second embodiment, any input of the address bits A0 to A12 is not required. Therefore, at least in write processing on relief address information, the probe 401c for supplying the address signal ADD is not necessary.

Figure 7:
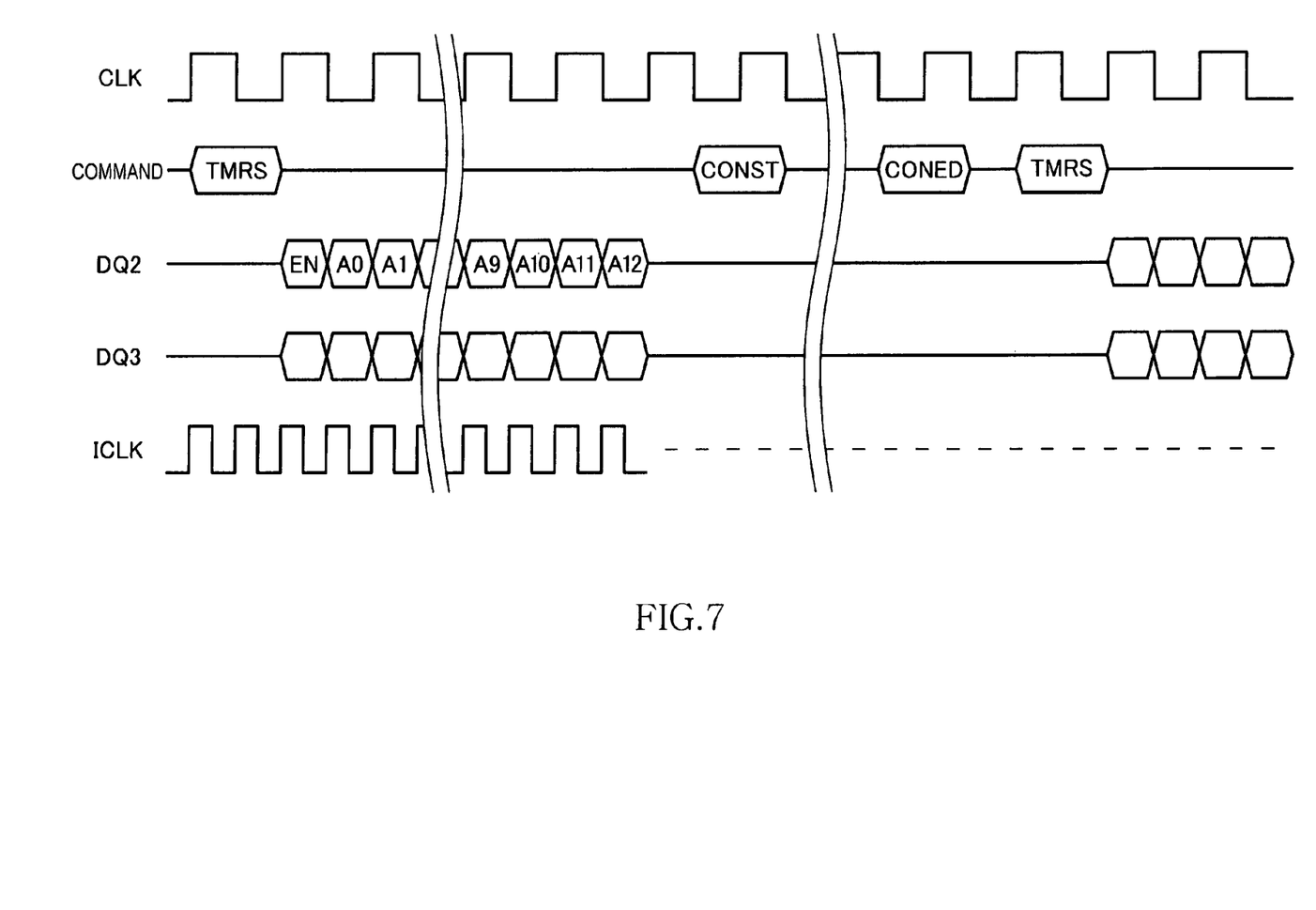
FIG. 7 is a timing chart for explaining an operation of the anti-fuse control circuit 200.

FIG. 7 is a timing chart for explaining an operation of the anti-fuse control circuit 200.

As shown in FIG. 7, after the relief-address setting command TMRS is activated, the data bit DQ2 is input serially. In this example, the first-input data bit DQ2 corresponds to the enable bit EN, then subsequent ones correspond to the address bits A0, A1 and onwards in order, and the data bit DQ2, which is input finally, corresponds to the address bit A11. As for the input of the data bit DQ3, it is same as in the anti-fuse control circuit 100 according to the first embodiment.

Such a serial input of the data bit DQ2 leads to the state of relief address information that has been written into the shift register 210 shown in FIG. 6. When the write start command CONST is activated in this state, the relief address information set in the shift register 210 is written into a designated fuse set. Thereafter, when the write end command CONST is activated, writing at the corresponding address is completed. After that, the above operation is repeated to write all the series of relief address information into the fuse sets, respectively.

As described above, according to the second embodiment, the serially-input data bit DQ2 is serial/parallel-converted by the shift register 210, and therefore any input of the address bits A0 to A12 is not required. This can achieve simplifying of a circuit configuration and eliminate the need for the probe 401c at least in write processing on relief address information.

It is apparent that the present invention is not limited to the above embodiments, but may be modified and changed without departing from the scope and spirit of the invention.

For example, while the above embodiments have explained a case that the present invention is applied to an SDRAM, the application target of the present invention is not limited thereto. Therefore, the present invention can be applied to other types of semiconductor memories and also to logic semiconductor devices.

Furthermore, fuse elements included in a fuse set are not limited to anti-fuse elements, but other types of elements can be used as far as they are electrically writable.

What is claimed is:

1. A semiconductor device comprising:
a memory cell array that includes a plurality of word lines, a plurality of bit lines each intersecting the word lines and a plurality of memory cells each disposed at an associated one of intersections of the word and bit lines;
a first terminal that is supplied with a string of first signals, the string of first signals being serially supplied to the first terminal from an outside of the device;
a relief-address generating circuit that is coupled to the first terminal to generate a relief address in response to the string of first signals, the relief address comprising a plurality of bits that correspond to the first signals, respectively, and being used to identify at least one of a failed one of the word lines and a failed one of the bit lines;
a fuse set; and
a programming circuit that programs the relief address into the fuse set so that the fuse set retains and provides the relief address to identify the at least one of a failed one of the word lines and a failed one of the bit lines.

2. A device comprising:
a memory cell array including a plurality of word lines, a plurality of bit lines, a plurality of normal memory cells each coupled to associated ones of the word and bit lines, and a plurality of redundant memory cells;
a first terminal configured to be supplied with a first data signal in a first mode and with a first address signal in a second mode;
an information storage circuit configured to be written with address information, the address information identifying at least one of a failed one of the word lines and a failed one of the bit lines;
a control circuit coupled between the first terminal and the information storage circuit and activated in the second mode to write the address information into the information storage circuit in response to the first address signal supplied to the first terminal so that the information storage circuit retains and provides the address information that identifies the at least one of a failed one of the word lines and a failed one of the bit lines;
an address terminal configured to be supplied with an access address in the first mode; and an access circuit coupled to the address terminal, the information storage circuit and the memory cell array and activated in the first mode to compare the access address with the address information and access, when the access address is not coincident with the address information, at least one of the normal memory cells and, when the access address is coincident with the address information, at least one of redundant memory cells in place of the normal memory cells,
the first data signal supplied in the first mode to the first terminal being conveyed from or into, when the access address is not coincident with the address information, the at least one of the normal memory cells, and when the access address is coincident with the address information, the at least one of redundant memory cells in place of the normal memory cells.

3. The device as claimed in claim 2, wherein the first address signal comprises a plurality of bits, the bits of the first address signal being supplied in series to the first terminal.

4. The device as claimed in claim 3, further comprising a second terminal, the information storage circuit including a plurality of storage areas, the control circuit being configured to select one or ones of the storage areas of the information storage circuit in response to a signal supplied to the second terminal.

5. The device as claimed in claim 4, wherein the second terminal is configured to be supplied with a second data signal in the first mode and with a second address signal in the second mode, the control circuit selecting one or ones of the storage areas of information storage circuit in response to the second address signal supplied to the second terminal.

6. The device as claimed in claim 5, wherein the second address signal comprises a plurality of bits, the bits of the second address signal being supplied in series to the second terminal.

7. The device as claimed in claim 4, wherein each of the storage areas comprises a fuse circuit that is electrically written with the address information.

8. A method comprising:
obtaining relief address information for a semiconductor device, the relief address information comprising a plurality of bits to identify a failed address among a plurality of access addresses of the semiconductor device, each of the access addresses being to be subject to a data read/write operation, the failed address being prevented from the data read/write operation; and
supplying the semiconductor device with the bits of the relief address information in series.

9. The method as claimed in claim 8, wherein the semiconductor device includes a plurality of fuse sets, one of the fuse sets being designated by a combination of bits of the fuse address information, and the method further comprises supplying the semiconductor device with the bits of the fuse address information in series.

10. The method as claimed in claim 9, wherein the supplying the relief address information and the supplying the fuse address information are performed at least in part in synchronism with each other.

11. The method as claimed in claim 8, wherein the semiconductor device includes at least one data terminal from and into which data is read and written, and the supplying the relief address information is carried out by use of the data terminal.

12. The device as claimed in claim 1,
wherein the first terminal is further supplied with a string of second signals, and the string of second signals being serially supplied to the first terminal from the outside of the device,
wherein the fuse set comprises a first fuse set, and the relief address comprises a first relief address,
wherein the device further comprises a second fuse set,
wherein the relief-address generating circuit further generates a second relief address in response to the string of second signals, the second relief address comprising a plurality bits that correspond to the second signals, respectively, and being used to identify at least one of another failed one of the word lines and another failed one of the bit lines, and
wherein the programming circuit programs the second relief address into the second fuse set so that the second fuse set retains and provides the second relief address to identify the at least one of another failed one of the word lines and another failed one of the bit lines.

13. The device as claimed in claim 1,
wherein the word lines, the bit lines and the memory cells comprise normal word lines, normal bit lines, and normal memory cells, respectively, and the memory cell array further includes at least one redundant word line, at least one redundant bit lines, and a plurality of redundant memory cell each connected to an associated one of the redundant word lines and an associated one of the redundant bit lines, and
wherein the device further comprises:
a set of second terminals supplied with address information that comprises a plurality of bits to designate at least one of one of the normal word lines and one of the normal bit lines, the bits of the address information being supplied respectively to the second terminals in parallel to each other; and
a circuit unit supplied with the address information from the set of second terminals and the relief address from the fuse set to detect whether the address information is matched with the relief address so that at least one of the redundant word lines and the redundant bit lines is selected in place of the at least one of one of the normal word lines and one of the normal bit lines when the address information is detected to be matched with the relief address.

14. The device as claimed in claim 13,
wherein the device further comprises a data circuit coupled to the memory cell array to receive a data signal read out therefrom and supply the data signal to the first terminal, and
wherein the each of the second terminals is provided independently from the first terminal.

15. The device as claimed in claim 14, wherein the first terminal is supplied with the data in a data read-out operation mode and with the string of first signals in a relief-address setting mode.

16. The device as claimed in claim 1, wherein the fuse set includes a plurality of anti-fuse elements, each of the anti-fuse elements being electrically programmed.

17. A semiconductor device comprising:
a memory cell array including a plurality of normal lines each coupled to a plurality of normal memory cells and a plurality of redundant lines each coupled to a plurality of redundant memory cells;
a plurality of fuse sets;
a first terminal configured in a relief-address setting mode to be supplied with a plurality of strings of first signals, each of the strings of first signals being serially supplied to the first terminal;
a relief-address generation circuit generating a plurality of relief addresses in response to the strings of first signals, respectively, each of relief addresses being used to identify a different one of failed ones of the normal lines;
a second terminal configured in the relief-address setting mode to be supplied with a plurality of strings of second signals, each of the strings of second signals being serially supplied to the second terminal;
a selection circuit selecting a different one of fuse sets in response to each of the strings of second signals;
a programming circuit configured in the relief-address setting mode to program each of the relief addresses into a different one of the fuse sets selected by the selection circuit so that each of the fuse sets retains and provides a different one of the failed ones of the normal lines; and
an access control circuit configured in a data read/write operation mode to be supplied with a plurality of access addresses and to detect whether each of the access addresses is coincident with any one of the relief addresses retained in the fuse sets so that, when one or ones of the access addresses, which is or are coincident with one or ones of the relief addresses, is or are supplied, one or ones of the redundant lines is or are activated in place of one or ones of the failed ones of the normal lines, to read or write data from or into one or ones of the redundant memory cells in place of one or ones of the normal memory cells, respectively, and that when one or ones of the access addresses, which is or are not coincident with one or ones of the relief addresses, is or are supplied, one or ones of the normal lines other than the failed ones of the normal lines is or are activated, to read or write data from or into one or ones of the normal memory cells, respectively.

18. The device as claimed in claim 17, further comprising a set of third terminals configured in the data read/write operation mode to be supplied with each of the access addresses.

19. The device as claimed in claim 18, wherein the first terminal, the second terminal and the set of third terminals are provided independently of one another, and each of the first and second terminals is configured in the data read/write operation mode to be supplied with the read or write data that is or are to be read out or written into one or ones of the normal or redundant memory cells.

20. The device as claimed in claim 17, wherein each of the strings of first signals is serially supplied to the first terminal in synchronism with each of the strings of second signals being supplied to the second terminal.

21. The device as claimed in claim 17, wherein the normal lines include a plurality of normal word lines and a plurality of normal bit lines, and the redundant lines includes a plurality of redundant word lines and a plurality of redundant bit lines, each of fuse sets retaining and providing one of a word relief address indicative of a failed one of the normal word lines and a bit relief address indicative of a failed one of the normal bit lines.

* * * * *